United States Patent
Xi et al.

(10) Patent No.: US 7,833,695 B2
(45) Date of Patent: Nov. 16, 2010

(54) METHODS OF FABRICATING METAL CONTACT STRUCTURES FOR LASER DIODES USING BACKSIDE UV EXPOSURE

(75) Inventors: Jingqun Xi, Pained Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 712 days.

(21) Appl. No.: 11/809,117

(22) Filed: May 31, 2007

(65) Prior Publication Data

US 2008/0299495 A1   Dec. 4, 2008

(51) Int. Cl.
    *G03F 7/26* (2006.01)
(52) U.S. Cl. ............................................ 430/314
(58) Field of Classification Search ............... 430/311, 430/314, 319, 320, 328, 394, 330
    See application file for complete search history.

(56) References Cited

U.S. PATENT DOCUMENTS

| | | | |
|---|---|---|---|
| 3,615,471 A | 10/1971 | Lenoble et al. | 96/38.3 |
| 4,949,352 A | 8/1990 | Plumb | 372/46 |
| 5,010,027 A | 4/1991 | Possin et al. | 437/41 |
| 5,059,552 A | 10/1991 | Harder et al. | 437/129 |
| 5,474,954 A | 12/1995 | Yang | 437/129 |
| 6,358,672 B2 * | 3/2002 | Jeoung et al. | 430/311 |
| 6,566,274 B1 * | 5/2003 | Jacot et al. | 438/739 |
| 6,709,881 B2 | 3/2004 | Hasegawa et al. | 438/24 |
| 6,946,390 B2 | 9/2005 | Schmidt | 438/637 |
| 7,008,810 B2 | 3/2006 | Hoss et al. | 438/39 |
| 7,012,022 B2 | 3/2006 | Liu et al. | 438/636 |
| 7,061,022 B1 | 6/2006 | Pham et al. | 257/79 |
| 7,160,474 B2 | 1/2007 | Harding | 210/801 |
| 2002/0187577 A1 | 12/2002 | Sakata et al. | 438/39 |
| 2002/0187579 A1 | 12/2002 | Kubota | 438/43 |
| 2004/0063236 A1 | 4/2004 | Kwak et al. | 438/39 |
| 2004/0086807 A1 * | 5/2004 | Peng et al. | 430/317 |
| 2004/0147094 A1 | 7/2004 | Haberern et al. | 438/478 |
| 2004/0209192 A1 * | 10/2004 | Lin et al. | 430/311 |
| 2005/0178471 A1 | 8/2005 | Goto et al. | 148/33.2 |
| 2006/0286490 A1 | 12/2006 | Sandhu et al. | 430/394 |
| 2007/0007544 A1 | 1/2007 | Haberern et al. | 257/103 |

OTHER PUBLICATIONS

"High Power AlGaIaN Laser Diodes with high Kink level and Low Relative Intensity Noise," Tojyo, et al Jpn. J. Appl. Phys. vol. 42 (2002) p. 1829 -1833.

"Development of AlInGaN based blue-violet lasers on GaN and SiC substrates," C. Rumbolz, et al Phys. Stat. Sol. (a) 203, No. 7, 1792-1796 (2006).

* cited by examiner

*Primary Examiner*—Mark F Huff
*Assistant Examiner*—Caleen O Sullivan
(74) *Attorney, Agent, or Firm*—Kwadjo Adusei-Poku

(57) ABSTRACT

Methods of fabricating a metal contact structure for a laser diodes are provided, wherein the method comprises providing a UV transparent semiconductor substrate, a UV transparent semiconductor epilayer defining a ridge disposed between etched epilayer edges, the epilayer being disposed over the UV transparent semiconductor substrate, and a UV opaque metal layer disposed over the epilayer ridge, applying at least one photoresist layer (positive photoresist, image reversal photoresist, or negative photoresist) over the opaque metal layer and epilayer edges, and selectively developing regions of the photoresist layer via backside exposure to UV light with the opaque metal layer used as a photolithographic mask.

18 Claims, 9 Drawing Sheets

METHODS OF FABRICATING METAL CONTACT STRUCTURES FOR LASER DIODES USING BACKSIDE UV EXPOSURE

BACKGROUND

The present invention is generally directed to metal contact structure fabrication for laser diodes, and is specifically directed to methods of fabricating a metal contact over a ridge of a laser diode using backside UV photolithography.

SUMMARY

The present inventors have recognized that registration error in index-guided laser diode fabrication between the patterns on the semiconductor wafer and the mask patterns can lead to current leakage as a result of misalignment between the p-contact metal on the ridge top and the contact opening.

According to one embodiment of the present invention, a method of fabricating a metal contact structure for a laser diode that eliminates registration error is provided. The method comprises providing a UV transparent semiconductor substrate, a UV transparent semiconductor epilayer defining a ridge disposed between etched epilayer edges, wherein the epilayer is disposed over the UV transparent semiconductor substrate. A UV opaque metal contact layer is also provided over the epilayer ridge. The method further comprises the steps of applying at least one positive photoresist layer over the opaque metal contact layer and epilayer edges, and selectively developing the regions of the positive photoresist layer disposed over the epilayer edges by backside exposure to UV light. With backside UV exposure, the UV light is first delivered through the bottom surface of the UV transparent semiconductor substrate. The opaque metal contact layer facilitates the selective development by preventing regions of the positive photoresist layer disposed over the opaque metal from being exposed to UV light. The method also comprises the steps of removing the developed photoresist regions over the epilayer edges, applying a dielectric layer over the undeveloped photoresist regions and the epilayer edges, removing undeveloped photoresist regions and the portion of the dielectric layer disposed over the undeveloped photoresist regions; and forming the metal contact structure by applying a metal layer over the dielectric layer and the opaque metal contact layer.

In another embodiment, another method of fabricating a metal contact structure for laser diode using an image reversal photoresist layer is provided. The method comprises applying a UV transparent dielectric layer over the opaque metal contact layer and the epilayer edges, and applying at least one image reversal photoresist layer over the UV transparent dielectric layer, and selectively developing the regions of the image reversal photoresist layer disposed over the epilayer edges by backside exposure to UV light. The method also includes the steps of stabilizing developed photoresist regions over the epilayer edges by photoresist baking, and then selectively developing the regions of the image reversal photoresist layer disposed over the opaque metal by exposing a top surface of the image reversal photoresist layer to UV light. The photoresist baking step disables the UV light sensitivity of the photoresist region over the epilayer edges. Moreover, the method includes the steps of removing developed photoresist regions over the opaque metal contact layer, removing the photoresist regions over the epilayer edges, and forming the metal contact structure on the ridge for laser diode by applying a metal layer over the dielectric layer and the opaque metal contact layer.

According to yet another embodiment, a method of fabricating a metal contact structure for a laser diode using a negative photoresist is provided. The method comprises applying a UV transparent dielectric layer over the opaque metal contact layer and the epilayer edges, applying at least one negative photoresist layer over the UV transparent dielectric layer, and selectively developing the regions of the negative photoresist layer disposed over the opaque metal contact layer by limiting backside exposure of UV light to the photoresist regions over the epilayer edges and subsequent photoresist baking. The method further comprises removing developed photoresist regions over the opaque metal layer, removing undeveloped photoresist regions over the epilayer edges, and forming the contact structure for the laser diode by applying a metal layer over the dielectric layer and the opaque metal layer.

These and additional features provided by the embodiments of the present invention will be more fully understood in view of the following detailed description, in conjunction with the drawings.

BRIEF DESCRIPTION OF THE DRAWINGS

The following detailed description of specific embodiments of the present invention can be best understood when read in conjunction with the drawings enclosed herewith. The drawing sheets include.

Figure 1A:
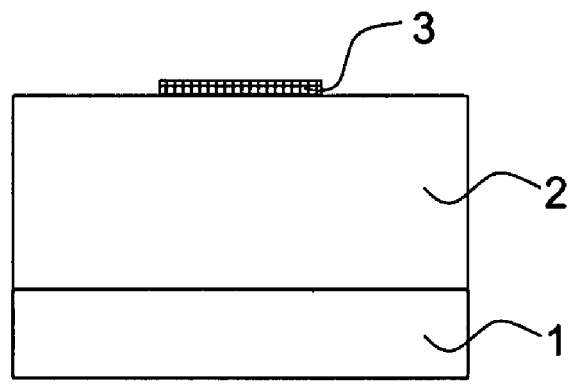
FIGS. 1A to 1H illustrates the process of fabricating a metal contact structure for a laser diodes by utilizing a positive photoresist layer in conjunction with backside UV exposure, according to one or more embodiments of the present invention.

The embodiments set forth in the drawings are illustrative in nature and not intended to be limiting of the invention defined by the claims. Moreover, individual features of the drawings and the invention will be more fully apparent and understood in view of the detailed description.

DETAILED DESCRIPTION

The present invention is directed to a method of fabricating a metal contact structure over a ridge of a laser diode by utilizing a photon sensitive photoresist layer over a UV opaque metal contact, which is formed over a UV transparent wafer.

As used herein, "wafer" refers to the UV transparent semiconductor substrate 1, the epilayer 2, and may also include other suitable layers familiar to one of ordinary skill in the art. Further as used herein, "over" means that one layer is applied on, but not necessarily directly on another layer. In the present invention, the addition of intervening layers, for example, cladding layers is contemplated herein. Furthermore, the term "over" does not require that the layer cover the entire surface, any may only include partial coverage. The photoresist layer is exposed from the backside of the wafer so that the photoresist pattern can exactly follow the pattern of the opaque metal, which is utilized as the photolithographic mask. Although the present application focuses on UV as the light source utilized to deliver the photons to the photoresist layers, it is contemplated that infrared, microwave and other suitable light sources would be feasible alternatives to UV light. Processes according to various embodiments of the present invention can be used to fabricate metal contact structures for narrow ridge lasers on transparent substrates, e.g. III-N substrate, while eliminating registration error. Moreover, methods according to various embodiments of the present invention may be used to fabricate contact metal layer on a narrow ridge for lasers diodes with edge widths less than about 2 µm, although the concepts of the present invention are applicable to fabrication of opaque layers with a variety of larger and smaller dimensions.

Figure 2A:
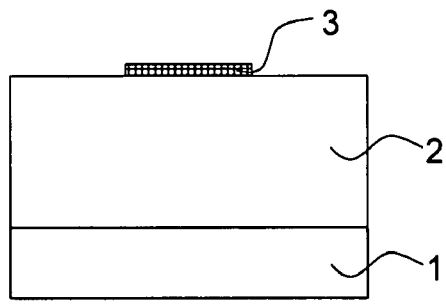
FIGS. 2A to 2I illustrates the process of fabricating a metal contact structure for a laser diodes by utilizing an image reversal photoresist layer in conjunction with backside UV exposure, according to one or more embodiments of the present invention.
Figure 3A:
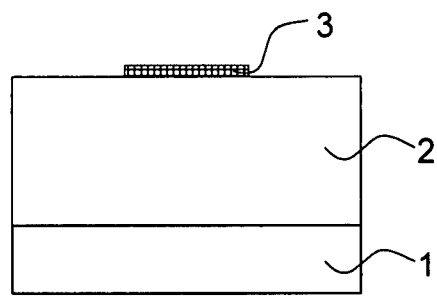
FIGS. 3A to 3H illustrates the process of fabricating a metal contact structure for a laser diodes by utilizing a negative photoresist layer in conjunction with backside UV exposure, according to one or more embodiments of the present invention.

Referring to the positive photoresist embodiment of FIGS. 1A-1H, a UV transparent semiconductor substrate 1 is provided, and at least one UV transparent epilayer 2 is formed thereon. For example, and not by way of limitation, the UV transparent semiconductor substrate 1 may comprise sapphire, gallium nitride, aluminum nitride, silicon carbide, or combinations thereof, and the UV transparent epilayer 2 may comprise an AlGaInN alloy. Other suitable UV transparent compositions are also contemplated for the substrate 1 and/or the epilayer 2. As shown in FIG. 1A (also in FIGS. 2A and 3A), a UV opaque metal layer 3 is deposited on the epilayer 2. The UV opaque metal layer 3 may comprise any opaque metal, e.g., Pd, Pt, Au, Ni, or combinations thereof. In addition to metals, other opaque compositions, such as opaque ceramics or polymers, are also considered feasible. Depending on the metal material used, the opaque metal layer 3 may comprise a variety of thicknesses. In a few exemplary embodiments, the opaque metal 3 may comprise Pd, Pt, Au, or Ni with thicknesses of 50 nm, 100 nm, 250 nm, or 100 nm, respectively.

Figure 1B:
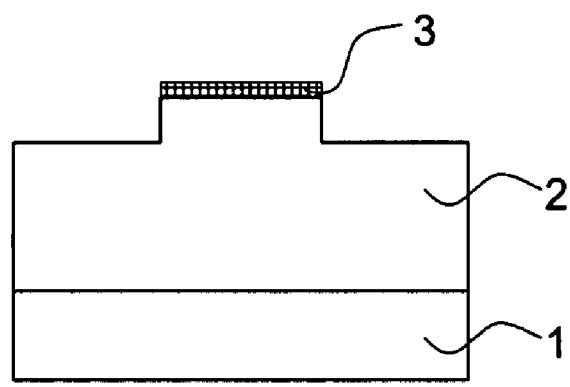
Figure 1C:
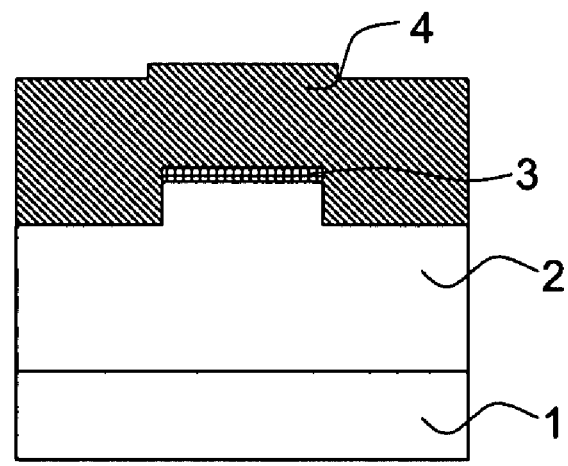
Figure 2B:
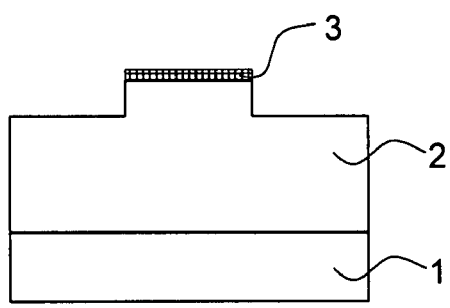
Figure 3B:
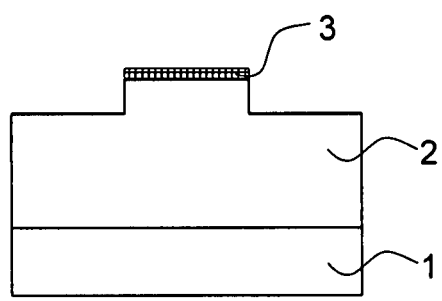

After the deposition of the opaque metal 3, an etching step may be conducted to form the upper ridge and the etched edges as shown in FIG. 1B (also FIGS. 2B and 3B). As used herein, the "edges" are the etched cutout regions in the epilayer 2, whereas the "ridge" is the upper surface of the non-etched region of the epilayer 2. The etching may include wet or dry etching (for example, reactive ion beam etching, chemical assistant ion beam etching or inductively coupled plasma etching). As shown in the embodiment of FIG. 1B, the opaque metal layer 3 may be disposed on the ridge. After the ridge is formed in FIG. 1B, a positive photoresist 4 is applied (for example, by spin coating) on top of the epilayer 2 edges and the opaque metal layer 3 as shown in FIG. 1C. The portion of the photoresist that is exposed to UV light becomes soluble to a photoresist developer and the unexposed portion of the photoresist is insoluble to a photoresist developer. One example of a suitable positive photoresist material is the AZ® 4210 positive photoresist material manufactured by AZ Electronic Materials Corp.

Figure 1D:
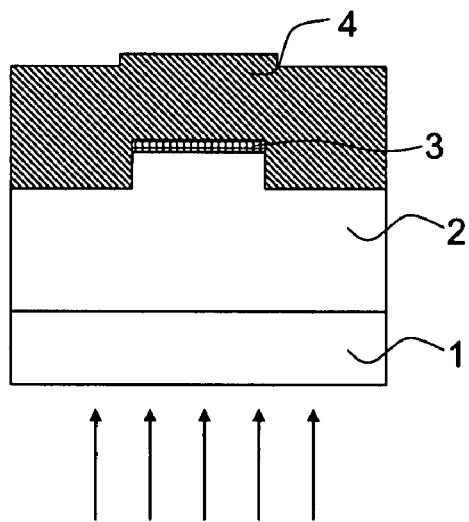

FIG. 1D depicts the positive photoresist layer 4 undergoing backside exposure photolithography. In this process, the UV is delivered through the bottom surface of the UV transparent substrate 1, the UV transparent epilayer 2, and then into the photoresist layer 4. The opaque metal layer 3 acts as a photolithographic mask, which prevents the positive photoresist 4 region over the opaque metal layer 3 from receiving the photon energy. As a result, this positive photoresist 4 region over the opaque metal layer 3 cannot be developed. However, the positive photoresist 4 region over the epilayer 2 receives photon energy via exposure to UV light, thus it is developed.

As used herein, "developed" means that a photoresist portion is made soluble to a photoresist developer, whereas "undeveloped" means a photoresist portion is insoluble to a photoresist developer.

Figure 1E:
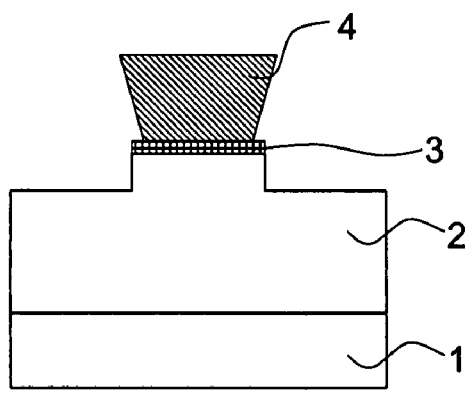

Referring to FIG. 1E, the developed region of the positive photoresist layer 4 is removed by the addition of a developer solution. The developed photoresist regions dissolve in the developer solution and are then flushed away, whereas the undeveloped regions are insoluble in the developer solution. Consequently, the developer solution must be capable of dissolving the developed regions while not dissolving the undeveloped regions. Examples of a suitable positive photoresist developer are the AZ400K, and AZ421K developers manufactured by AZ Electronic Materials Corp. Referring to FIG. 1E, only the undeveloped photoresist 4 regions over the opaque metal 3 is still present after the developed photoresist region is removed by the developer solution.

Figure 1F:
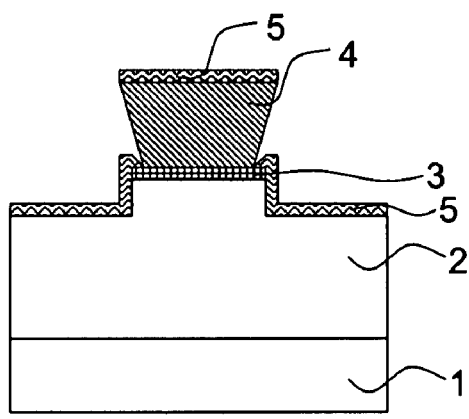
Figure 1G:
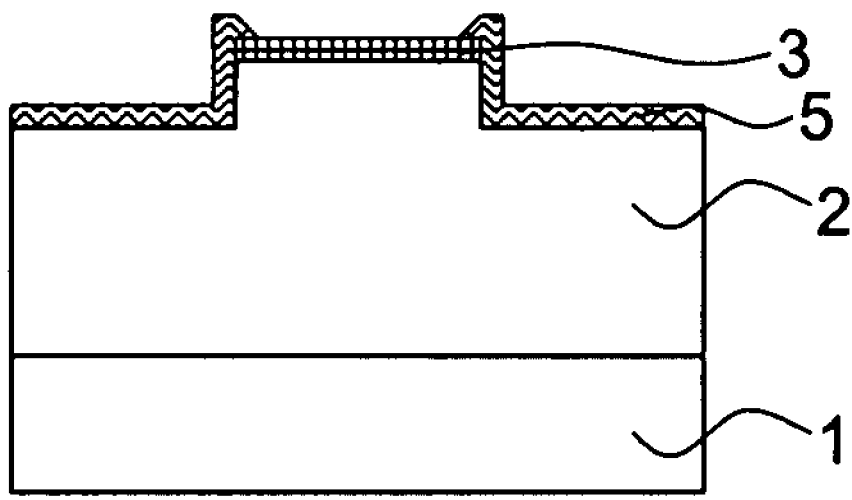

Subsequently, as shown in the embodiments of FIG. 1F, a dielectric layer 5, for example, UV transparent $SiO_2$ or $Si_3N_4$, can be applied over the remaining photoresist 4 and epilayer 2. The dielectric layer 5 may be applied through various conventional or yet to be developed processes. For example, and not by way of limitation, the dielectric layer 5 is applied by means of vapor deposition or by sputtering as a passivation layer. Referring to FIG. 1G, the remaining photoresist 4 region and the dielectric layer 5 thereon may be removed by using a photoresist stripper solution. The photoresist stripper is a solvent which dissolves the undeveloped photoresist regions, and, in addition, may remove any remaining developed photoresist material or organic residue. Suitable photoresist stripper compositions may include a variety of organic and inorganic solvents such as acetone or AZ400T manufactured by AZ Electronic Materials Corp. As the undeveloped photoresist regions dissolve, the dielectric layer 5 over the photoresist regions may be removed. This removal process may sometimes be called "liftoff".

Figure 1H:
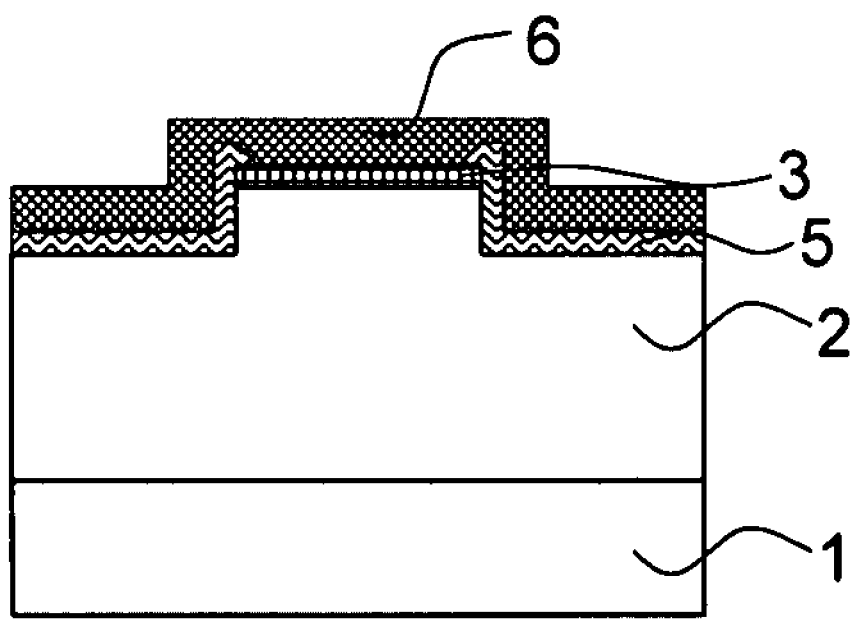

Referring to FIG. 1G, the opaque metal layer 3 is now exposed. As shown in FIG. 1H, a top metal layer 6 may then be applied over the opaque metal layer 3 and dielectric layer 5 to complete the fabrication of the metal contact structure over a ridge of a laser diode. The top metal layer 6 may comprise titanium, gold, palladium, platinum, nickel, and combinations thereof.

Figure 2C:
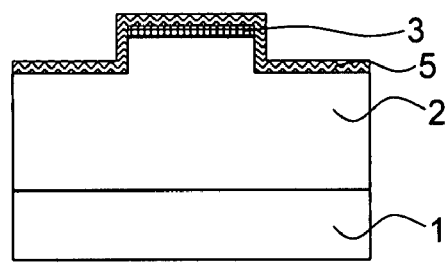
Figure 2D:
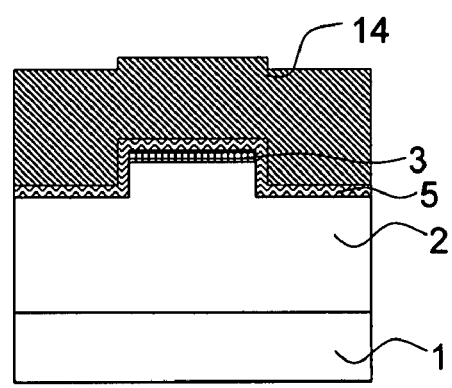

Referring to FIG. 2A-FIG. 2I, the ridge laser diode may be fabricated using image reversal photoresist 14. After the ridge and etched edges are formed as shown in FIG. 2B, a dielectric layer 5, for example, $SiO_2$ or $Si_3N_4$, can be deposited by means of vapor deposition or sputtering as shown in FIG. 2C. Referring to FIG. 2D, a layer of image reversal photoresist 14 is spin-coated on the dielectric layer 5. The image reversal photoresist 14 may comprise various materials, for example, AZ5214E and AZ5218E, which are distributed by AZ Electronic Materials Corp.

Figure 2E:
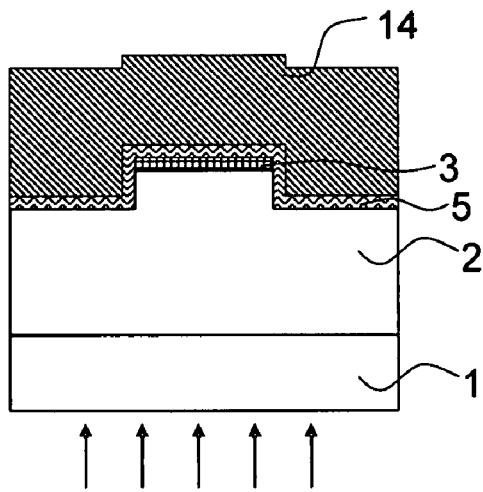
Figure 2F:
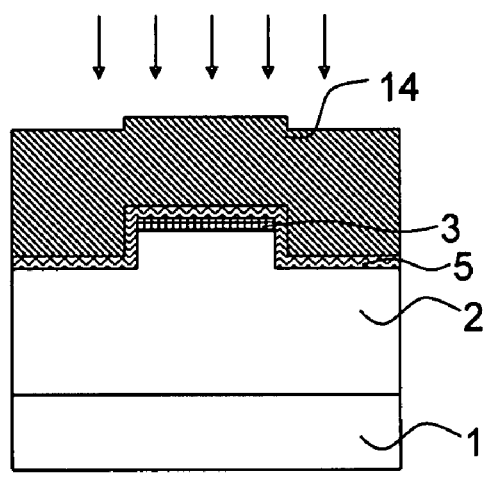
Figure 2G:
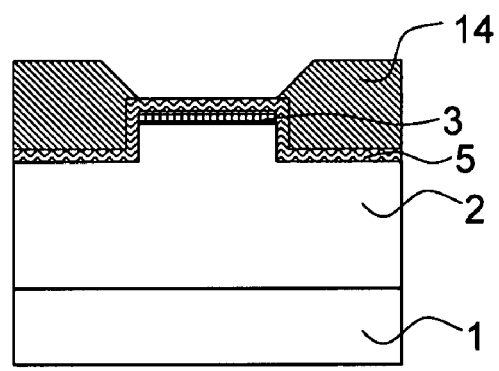

Referring to FIG. 2E, backside exposure photolithography is conducted. The region of the image reversal photoresist 14 over the epilayer 2 edges receives the photon energy and is stabilized. Subsequently, the method uses a photoresist baking step, which disables the photon sensitivity of the UV exposed photoresist region over the epilayer 2 edges as well as stabilizes this region. After the baking step, the photoresist layer 14 is exposed to UV light from its top surface, as shown in FIG. 2F. Because the baking step disabled the photon sensitivity of the photoresist region over the epilayer 2 edges, only the photoresist 14 region over the opaque metal 3 is developed due to UV exposure. At which point, the developed photoresist 14 region over the opaque metal 3 is dissolved in a developer solution and removed, and consequently, a window above the opaque metal is opened, as shown in FIG. 2G. The developer solution may comprise AZ 400K, AZ 351B manufactured by AZ Electronic Materials Corp, as well as other suitable conventional or yet to be discovered developers.

Figure 2H:
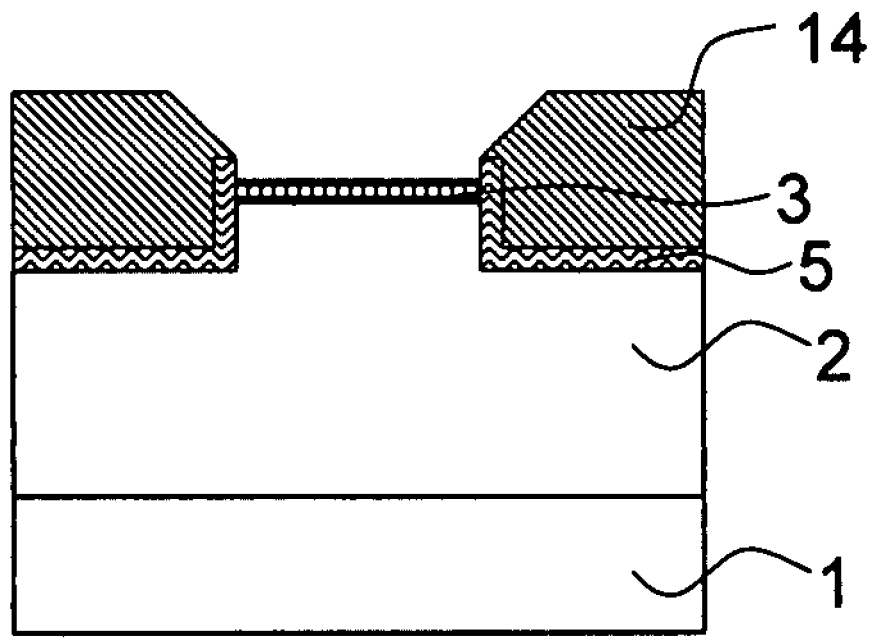
Figure 2I:
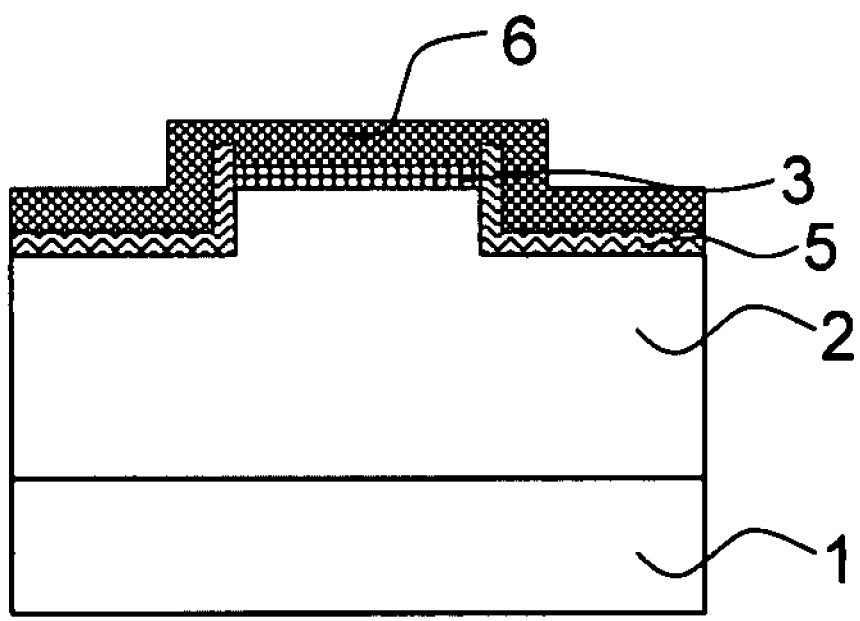

Referring to FIG. 2H, an etching step may be conducted to remove the dielectric layer 5 over the opaque metal 3. The remaining photoresist 14 regions over the epilayer 2 edges are removed by addition of a photoresist stripper as described above. Referring to FIG. 2I, a metal layer 6 is deposited over the opaque metal 3 and dielectric layer 5 to finish the fabrication of the metal contact structure of the laser diode.

Figure 3C:
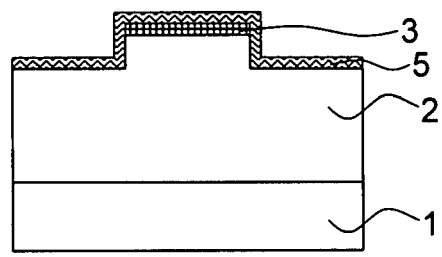
Figure 3D:
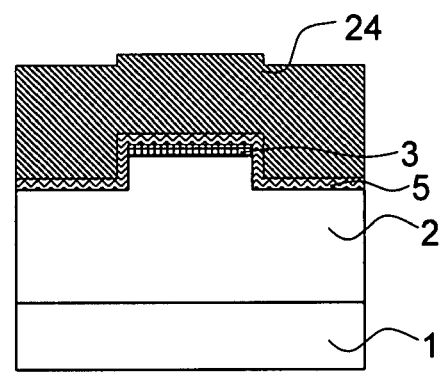
Figure 3E:
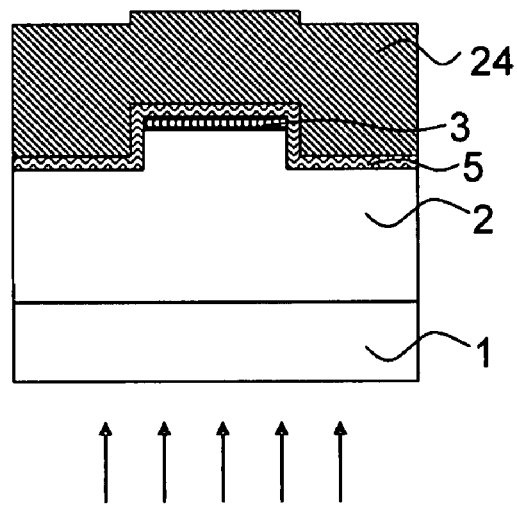
Figure 3F:
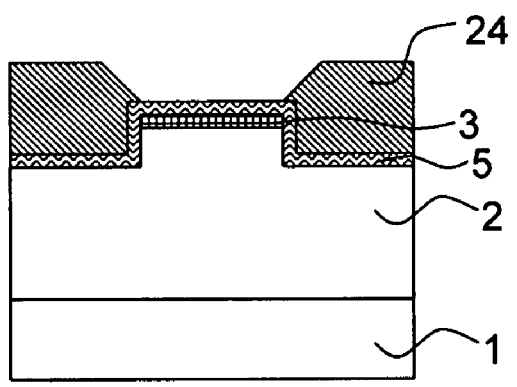
Figure 3G:
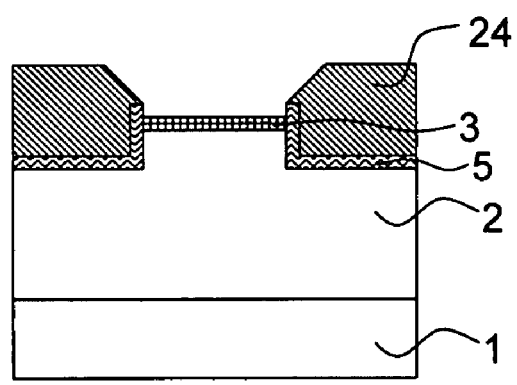
Figure 3H:
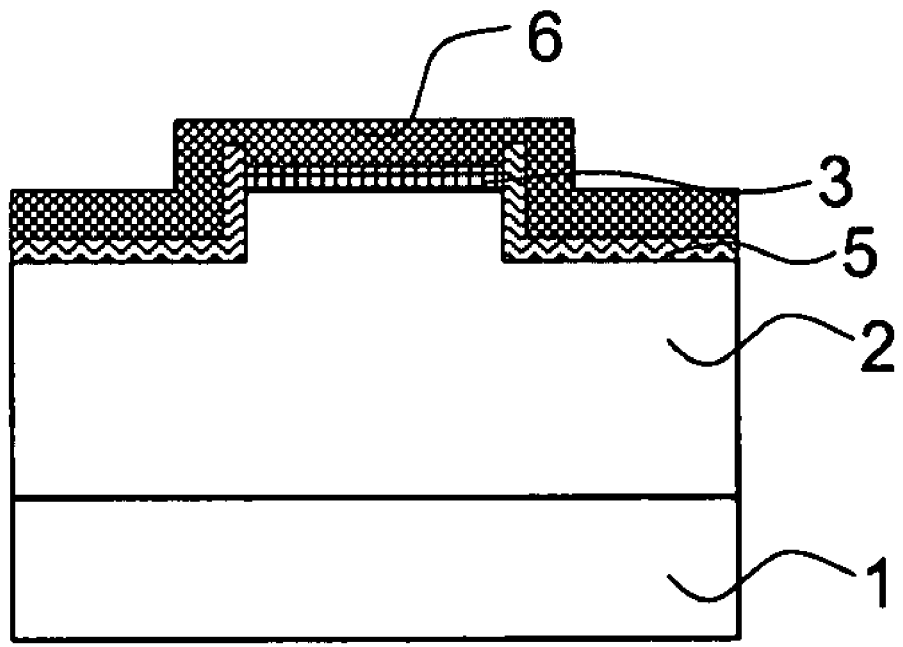

Referring to FIG. 3A through FIG. 3H, a method of fabricating a metal contact structure using a negative photoresist layer is provided. After the ridge and etched edges are formed in the epilayer 2 as shown in FIG. 3B, a dielectric layer 5 is deposited as shown in FIG. 3C. Then, as shown in FIG. 3D, a layer of negative photoresist 24 is applied via spin-coating. A negative resist is a photoresist, wherein the portion of the photoresist that is exposed to light becomes relatively insoluble to a photoresist developer, whereas the unexposed portion of the photoresist is dissolved by a photoresist developer. Suitable negative photoresists may include, but are not limited to, Futurrex NR7-1000P negative photoresist manufactured by Futurrex Inc. Referring to FIG. 5E, backside exposure photolithography is then conducted. The negative photoresist 24 region over the epilayer 2 edges is exposed to UV and is not developed, whereas the photoresist 24 region over the opaque metal 3 is not exposed to UV and is developed. In a further embodiment the present method may use a photoresist baking step to stabilize the UV exposed photoresist region over the epilayer 2 edges. The developed photoresist 24 region over the opaque metal is then dissolved in the presence of a developer solution. The developer solution for the negative photoresist 24 may comprise Futurrex RD6 manufactured by Futurrex Inc. as well as other suitable conventional or yet to be discovered developers. FIG. 3F illustrates that a window above the opaque metal 3 is opened after the removal of the developed photoresist 24 region. In FIG. 3G, an etching step is conducted to remove the dielectric layer 5 over the opaque metal 3. Finally, the photoresist 24 over the epilayer 2 edges is removed (e.g., through a photoresist stripper) and another thick metal layer 6 is deposited to finish the fabrication of the metal contact structure, as shown in FIG. 3H.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of fabricating a metal contact structure for a laser diode comprising:
    providing a UV transparent semiconductor substrate, a UV transparent semiconductor epilayer defining an epilayer ridge disposed between etched epilayer edges, the epilayer being disposed over the UV transparent semiconductor substrate, and a UV opaque metal layer disposed over the epilayer ridge;
    applying at least one positive photoresist layer over the UV opaque metal layer and epilayer edges;
    selectively developing the regions of the positive photoresist layer disposed over the epilayer edges by backside exposure to UV light, the UV light being first delivered through the bottom surface of the UV transparent semiconductor substrate, wherein the UV opaque metal layer prevents regions of the positive photoresist layer disposed over the UV opaque metal from exposure to UV light thereby the photoresist regions over the UV opaque metal layer are undeveloped;
    removing the developed photoresist regions over the epilayer edges;
    applying a dielectric layer over the undeveloped photoresist regions, and the epilayer edges;
    removing the undeveloped photoresist regions and the portion of the dielectric layer disposed over the undeveloped photoresist regions; and
    forming the metal contact structure of the laser diode by applying a metal layer over the dielectric layer and the UV opaque metal layer.

2. A method according to claim 1 wherein the epilayer edges are etched by reactive ion beam etching, chemical assistant ion beam etching, inductively coupled plasma etching, or combinations thereof.

3. A method according to claim 1 wherein the UV transparent semiconductor substrate comprises sapphire, gallium nitride, aluminum nitride, silicon carbide, or combinations thereof.

4. A method according to claim 1 wherein the UV transparent semiconductor epilayer comprises an AlGaInN alloy.

5. A method according to claim 1 wherein the UV opaque metal layer comprises platinum, palladium, gold, nickel, or combinations thereof.

6. A method according to claim 1 wherein the UV opaque metal layer comprises a width of less than about 2 µm.

7. A method according to claim 1 wherein the metal layer over the dielectric layer and the UV opaque metal layer comprises gold, palladium, platinum, nickel, and combinations thereof.

8. A method according to claim 1 wherein the dielectric layer is applied via vapor deposition, sputtering, or combinations thereof.

9. A method according to claim 1 wherein the dielectric layer comprises silicon oxide, silicon nitride, or combinations thereof.

10. A method according to claim 1 wherein the developed photoresist regions are removed by dissolving in a photoresist developer solution and the undeveloped photoresist regions are removed by dissolving in a photoresist stripper solution.

11. A method according to claim 1 wherein the positive photoresist layer is applied via spin coating.

12. A method of fabricating a metal contact structure for a laser diode comprising:
    providing a UV transparent semiconductor substrate, a UV transparent semiconductor epilayer defining an epilayer ridge disposed between etched epilayer edges, the epilayer being disposed over the UV transparent semiconductor substrate, and a UV opaque metal layer disposed over the epilayer ridge;
    applying a UV transparent dielectric layer over the opaque metal layer and the epilayer edges;
    applying at least one image reversal photoresist layer over the UV transparent dielectric layer;
    selectively developing the regions of the image reversal photoresist layer disposed over the epilayer edges by backside exposure to UV light, the UV light being first delivered through the bottom surface of the UV transparent semiconductor substrate, wherein the opaque metal layer prevents regions of the image reversal photoresist disposed over the opaque metal from exposure to UV light;

stabilizing developed photoresist regions over the epilayer edges by photoresist baking;

selectively developing the regions of the image reversal photoresist layer disposed over the UV opaque metal by exposing a top surface of the image reversal photoresist layer to UV light, wherein the photoresist baking step disables the UV light sensitivity of the photoresist region over the epilayer edges, thereby the photoresist regions over the epilayer edges are undeveloped;

removing developed photoresist regions over the opaque metal layer;

removing the undeveloped photoresist regions over the epilayer edges; and forming the metal contact structure of the laser diode by applying a metal layer over the dielectric layer and the opaque metal layer.

13. A method according to claim 12 further comprising etching the portion of the dielectric layer over the opaque metal layer.

14. A method according to claim 12 wherein the developed photoresist regions are removed by dissolving in a photoresist developer solution and the undeveloped photoresist regions are removed by dissolving in a photoresist stripper solution.

15. A method of fabricating a metal contact structure for a laser diode comprising:

providing a UV transparent semiconductor substrate, a UV transparent semiconductor epilayer defining an epilayer ridge disposed between etched epilayer edges, the epilayer being disposed over the UV transparent semiconductor substrate, and a UV opaque metal layer disposed over the epilayer ridge;

applying a UV transparent dielectric layer over the UV opaque metal layer and the epilayer edges;

applying at least one negative photoresist layer over the UV transparent dielectric layer;

selectively developing the regions of the negative photoresist layer disposed over the UV opaque metal layer by limiting backside exposure of UV light to the photoresist regions over the epilayer edges, the UV light being first delivered through the bottom surface of the UV transparent semiconductor substrate, wherein the UV opaque metal layer prevents regions of the negative photoresist layer disposed over the UV opaque metal from exposure to UV light, thereby the negative photoresist regions over the epilayer edges are undeveloped and the negative photoresist regions over the UV opaque metal layer are developed;

removing developed photoresist regions over the UV opaque metal layer;

removing undeveloped photoresist regions over the epilayer edges; and forming the metal contact structure on the ridge for the laser diode by applying a metal layer over the dielectric layer and the UV opaque metal layer.

16. A method according to claim 15 further comprising etching the portion of the dielectric layer over the UV opaque metal layer.

17. A method according to claim 15 wherein the developed photoresist regions are removed by dissolving in a photoresist developer solution and the undeveloped photoresist regions are removed by dissolving in a photoresist stripper solution.

18. A method according to claim 15 further comprising stabilizing the undeveloped regions over the epilayer edges by photoresist baking.

* * * * *